United States Patent
Prakash et al.

(10) Patent No.: US 7,827,342 B2
(45) Date of Patent: Nov. 2, 2010

(54) READBACK REGISTERS

(75) Inventors: Rahul Prakash, Dallas, TX (US); Keith C. Brouse, Murphy, TX (US); Joselito L. Parguian, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 181 days.

(21) Appl. No.: 12/276,150

(22) Filed: Nov. 21, 2008

(65) Prior Publication Data

US 2010/0127907 A1    May 27, 2010

(51) Int. Cl.
*G06F 13/14*    (2006.01)

(52) U.S. Cl. .................... 710/305; 710/29; 710/62; 710/71

(58) Field of Classification Search .............. 710/29, 710/62, 71, 305
See application file for complete search history.

(56) References Cited

U.S. PATENT DOCUMENTS

| | | | |
|---|---|---|---|
| 4,648,105 A * | 3/1987 | Priebe et al. ............... 377/64 |
| 4,903,240 A * | 2/1990 | Von Flue ............... 365/189.02 |
| 5,235,602 A | 8/1993 | Klim |
| 5,303,227 A | 4/1994 | Herold et al. |
| 5,524,249 A * | 6/1996 | Suboh ...................... 713/322 |
| 5,995,988 A * | 11/1999 | Freidin et al. ............... 708/232 |
| 6,122,683 A * | 9/2000 | Ku et al. ...................... 710/71 |
| 6,226,755 B1 * | 5/2001 | Reeves ...................... 713/400 |
| 6,499,070 B1 * | 12/2002 | Whetsel ...................... 710/71 |
| 6,594,094 B2 * | 7/2003 | Rae et al. ...................... 360/25 |
| 6,703,961 B2 | 3/2004 | Mueck et al. |
| 6,993,616 B2 * | 1/2006 | McLachlan ................. 710/305 |
| 7,126,860 B2 * | 10/2006 | Pratlong et al. ........ 365/189.05 |
| 7,691,063 B2 * | 4/2010 | Peteresen et al. ............ 600/447 |
| 2003/0163676 A1 * | 8/2003 | Burk et al. .................. 712/228 |
| 2009/0271555 A1 * | 10/2009 | Bond et al. ................. 710/308 |

FOREIGN PATENT DOCUMENTS

EP    0 518 511    12/1992

OTHER PUBLICATIONS

AD5025/AD5045/AD5065, pp. 1-28, AD5530/AD5531, pp. 1-16.

* cited by examiner

*Primary Examiner*—Linh V Nguyen
(74) *Attorney, Agent, or Firm*—John J. Patti; Wade J. Brady, III; Frederick J. Telecky, Jr.

(57) ABSTRACT

A method reading bank register values is provided. Register values are stored in a readback bank. The register values are output sequentially from the serial bank. An indicator is received by the serial bank. A determination is then made as to whether the indicator was received by the serial bank prior to completion of the outputting of the register values. If the indicator was received prior to completion of the outputting of the register values, the register values are loaded into the serial bank from the readback bank.

18 Claims, 4 Drawing Sheets

READBACK REGISTERS

TECHNICAL FIELD

The invention relates generally to a digital to analog converter (DAC) and, more particularly, to readback registers for a DAC unit.

BACKGROUND

DAC units or DAC integrated circuits (IC) are in common use. Typically, during operation, the DAC units receive serial data, such as commands, through a serial input channel. To indicate that serial data (which is comprised of a bit stream) is to be received, a synchronization or sync signal is used. This sync signal can indicate both the beginning and end of a bit stream through a transition of logic states (rising or falling edges). Some examples of prior art DACs or DAC units are as follows: European Patent No. 0518511; U.S. Pat. Nos. 5,235, 602; 5,303,227; 6,703,961; 6,993,616; and the data sheet for the AD5025/45/65 and AD5530/31.

SUMMARY

A preferred embodiment of the present invention, accordingly, provides a method. The method comprises storing register values in a readback bank; outputting the register values sequentially from the serial bank; receiving an indicator by the serial bank; determining whether the indicator was received by the serial bank prior to completion of the outputting of the register values; and loading the register values into the serial bank from the readback bank if the indicator was received prior to completion of the outputting of the register values.

In accordance with another embodiment of the present invention, the method further comprises the step of outputting the register values sequentially from the serial bank after the step of loading.

In accordance with another embodiment of the present invention, the method further comprises receiving a second indicator, wherein the first indicator corresponds to an input of a readback command; serially receiving the readback command by a plurality of serial registers arranged in a series in a serial bank; and receiving a third indicator, wherein the second indicator indicates receipt of the feedback command.

In accordance with another embodiment of the present invention, the step of determining further comprises the step of counting clock periods; and comparing the counted clock periods to a predetermined threshold.

In accordance with another embodiment of the present invention, a digital to analog converter (DAC) unit is provided. The DAC unit comprises interface logic that receives a clock signal and a synchronization signal; a DAC that receives a digital input signal from the interface logic and outputs an analog output signal; command logic that is coupled to the interface logic and to the DAC, wherein the command logic includes a serial bank having a plurality of serial registers arranged in a series, wherein the serial bank sequentially loads a command signal into the serial registers in response to a first edge of the synchronization signal, and wherein the serial bank sequentially outputs register values; and a readback bank having a plurality of readback registers, wherein each register corresponds to at least one of the serial registers, wherein the readback bank stores the register values, and wherein the readback bank loads the register values into the serial bank when a second edge of the synchronization signal is detected before a predetermined number of periods of the clock signal.

In accordance with another embodiment of the present invention, the command logic further comprises decode logic adapted to output the register values to the serial bank and the readback bank.

In accordance with another embodiment of the present invention, the readback bank further comprises a plurality of multiplexers, wherein each multiplexer is adapted to receive at least one register value from the decode logic and is adapted to receive feedback from at least one readback register.

In accordance with another embodiment of the present invention, the DAC unit further comprises a count register that measures a number of clock cycles between successive edges of the synchronization signal; compares the number of clock cycles to a predetermined threshold; and outputs a frame count signal to the multiplexers of the readback bank.

In accordance with another embodiment of the present invention, the serial bank further comprises a plurality of multiplexers, wherein each multiplexer is interposed between at least two serial registers, and wherein each multiplexer is adapted to transfer an output from one serial register to another serial register.

In accordance with another embodiment of the present invention, the DAC unit further comprises an amplifier that amplifies the output of the DAC.

In accordance with another embodiment of the present invention, the DAC unit further comprises an input register coupled to the interface logic; and a DAC register interposed between the input register and the DAC.

In accordance with another embodiment of the present invention, an apparatus is provided. The apparatus comprises a plurality of DAC units arranged in a daisy-chain, wherein each DAC unit has serial-data-in (SDIN) input and a serial-data-out (SDO) output, and wherein the first DAC unit of the daisy-chain is adapted to receive a command signal at its SDIN input and the last DAC unit is adapted to output register values at its SDO output, and wherein each DAC unit between the first and the last DAC unit in the daisy-chain has its SDIN input coupled to the SDO output of the previous DAC unit, and wherein each DAC unit includes interface logic that receives a clock signal and a synchronization signal; DAC that receives a digital input signal from the interface logic and outputs an analog output signal; command logic that is coupled to the interface logic and to the DAC, wherein the command logic includes a serial bank having a plurality of serial registers arranged in a series, wherein the serial bank sequentially loads the command signal into the serial registers in response to a first edge of the synchronization signal, and wherein the serial bank sequentially outputs the register values; and a readback bank having a plurality of readback registers, wherein each readback register corresponds to at least one of the serial registers, wherein the readback bank stores the register values, and wherein the readback bank loads the register values into the serial bank when a second edge of the synchronization signal is detected before a predetermined number of periods of the clock signal.

In accordance with another embodiment of the present invention, the command logic further comprises decode logic adapted to output the register values to the serial bank and the readback bank.

In accordance with another embodiment of the present invention, the readback bank further comprises a plurality of multiplexers, wherein each multiplexer is adapted to receive at least one register value from the decode logic and is adapted to receive feedback from at least one readback register.

In accordance with another embodiment of the present invention, the DAC unit further comprises a count register that measures a number of clock cycle between successive edges of the synchronization signal; compares the number of clock cycles to a predetermined threshold; and outputs a frame count signal to the multiplexers of the readback bank.

In accordance with another embodiment of the present invention, the serial bank further comprises a plurality of multiplexers, wherein each multiplexer is interposed between at least two serial registers, and wherein each multiplexer is adapted to transfer an output from one serial register to another serial register.

In accordance with another embodiment of the present invention, the DAC unit further comprises an amplifier that amplifies the output of the DAC.

In accordance with another embodiment of the present invention, the DAC unit further comprises an input register coupled to the interface logic; and a DAC register interposed between the input register and the DAC.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
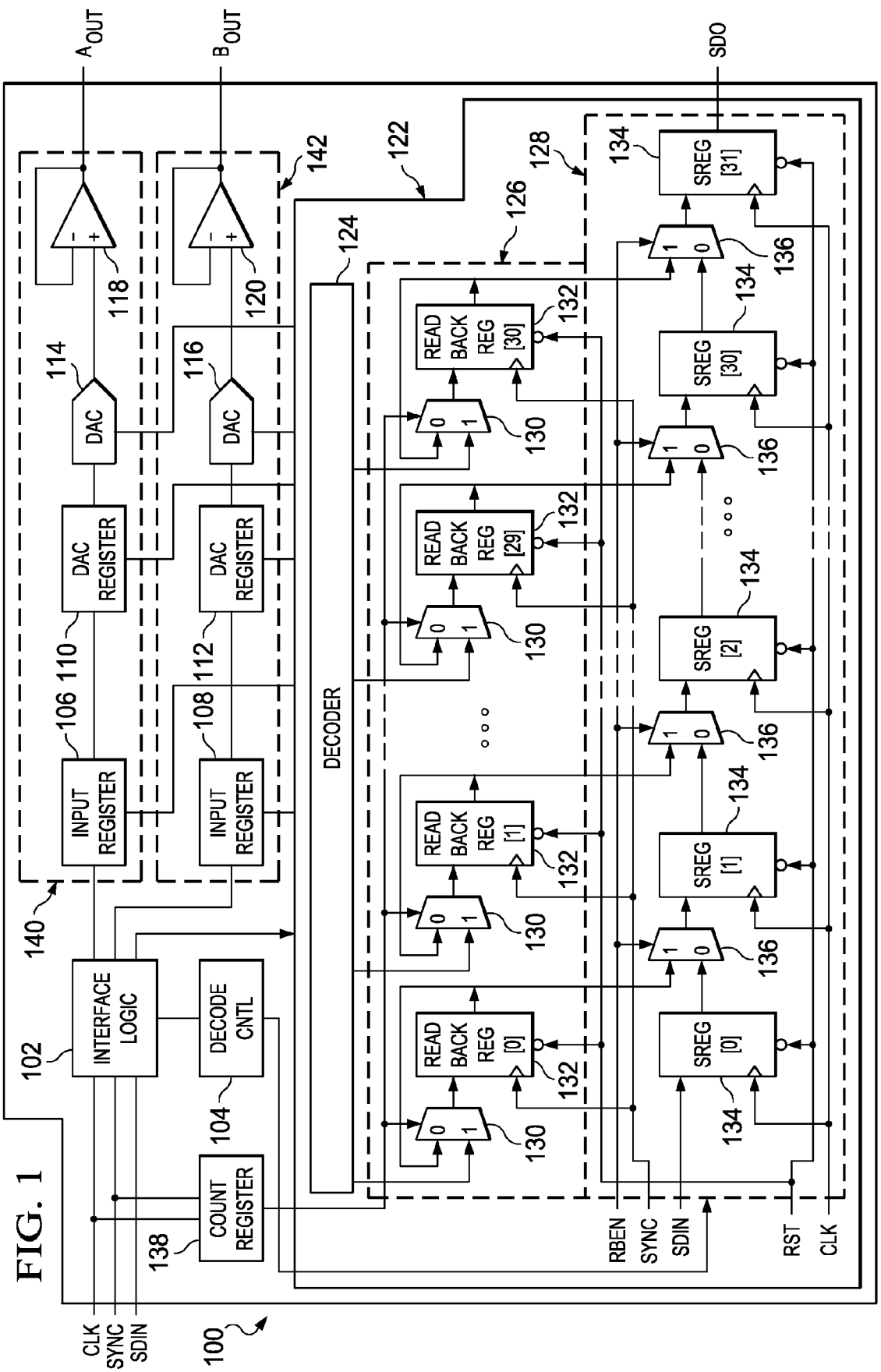
FIG. 1 is a DAC unit in accordance with an embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates a DAC unit. The DAC unit 100 is typically comprised of a single integrated circuit (IC) or chip having a plurality of output channels $A_{OUT}$ and $B_{OUT}$. In the configuration shown in FIG. 1, the DAC unit 100 is a dual channel DAC unit; however, other configurations, such as quad and octal channel DAC units, are also possible. The DAC unit 100 generally comprises interface logic 102, a decode controller 104, a count register 138, command logic 122, and pipelines 140 and 142 for each channel $A_{OUT}$ and $B_{OUT}$.

Figure 2:
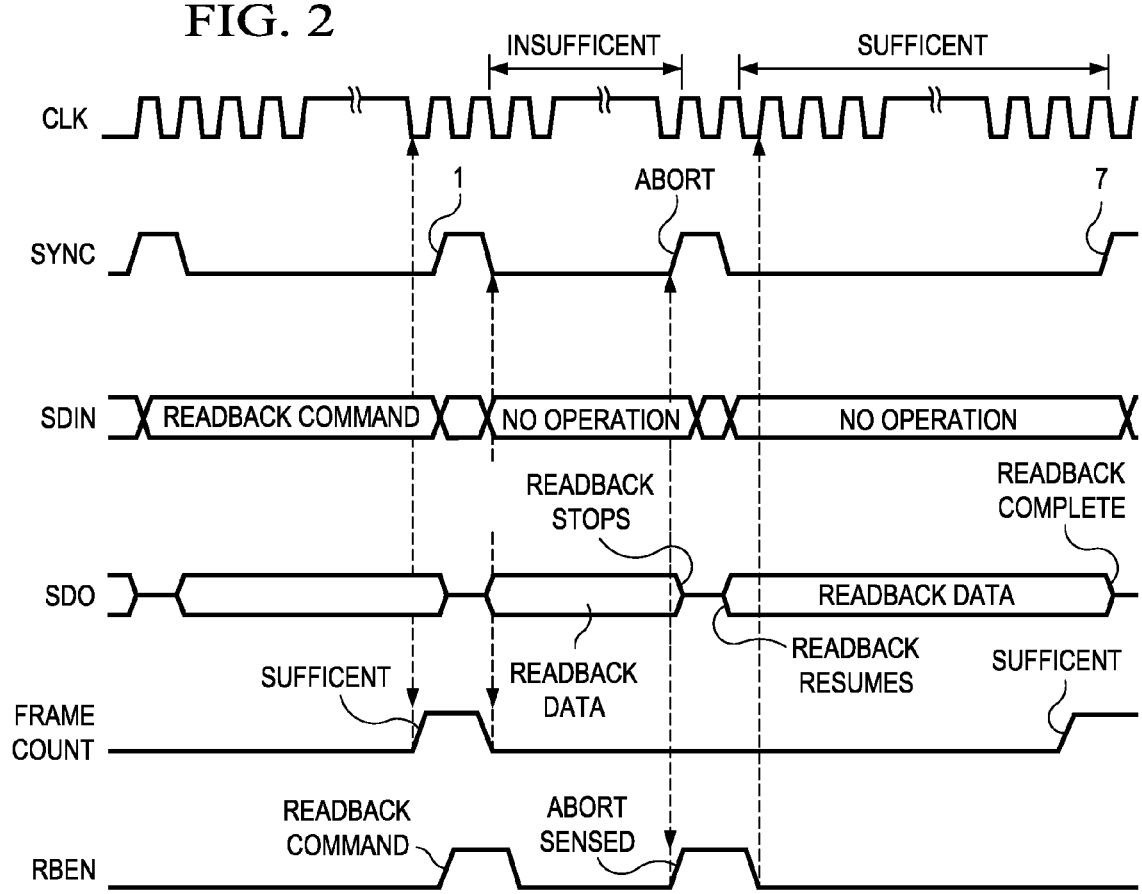
FIG. 2 is a timing diagram for the DAC unit of FIG. 1.

The operation of the DAC unit 100 can be explained through the timing diagram of FIG. 2. In operation, the interface logic 102 receives the clock signal CLK, the synchronization or sync signal SYNC, and the serial-data-in SDIN through various inputs or pins for the IC. The clock signal CLK generally allows all of the logic to be properly clocked or aligned, while the sync signal SYNC encapsulates operations between transitions and the serial-data-in SDIN receives commands or other control data to the unit 100.

Operation of the unit 100 begins with a transition of the sync signal SYNC from logic high to logic low, as shown in FIG. 2. After the transition of the sync signal SYNC, a command, such as a readback command, can be input to the interface logic 102 through the serial-data-in SDIN. This command can then be serially loaded into the serial bank 128 in synchronization with the clock signal CLK. Preferably, the serial bank 128 includes a plurality of serial registers 134 arranged in a sequence that serially receives the command. Typically, the command is 32 bits in length, indicating that 32 clock cycles would be used to serially load the command into the serial bank 128. Completion of the serial loading of the command would be indicated by a transition of the sync signal SYNC from logic low to logic high.

Under conditions where the command is a readback command, the decode controller 104 and decoder 124 can operate to gather information from the pipelines 140 and 142 or decode data from the serial bank 128. Preferably, the decode controller 104 and the decoder 124 can gather register values from the input registers 106 and 108 and/or the DAC registers 110 and 112 or decode data from the serial bank 128. These register values generally comprise digital signals that are to be converted to analog signals by the DACs 114 and 116 and output by amplifiers 118 and 120 through channels $A_{OUT}$ and $B_{OUT}$. These register values can include DAC data.

These register values can then be transferred to the readback bank 126. The readback of data is generally bounded by the frame count signal FRAME COUNT so that, when the frame count signal FRAME COUNT transitions from logic low to logic high, the register values can be transferred from the decoder 124 to the readback registers 132 in parallel and in synchronization with the clock signal CLK. Preferably, the transfer of register values from the decoder 124 to the readback registers 132 is accomplished through the use of multiplexers 130. Multiplexers 130 preferably have two ports: one port being coupled to the decoder 124 and the other port being coupled to the output of its corresponding readback register 132. These multiplexers 130 also use the frame count signal FRAME COUNT as a select or selection signal to select between the two ports.

Once the register values are stored in the readback bank 126, the register values can be transferred to the serial bank 128. A readback enable signal RBEN is employed to indicate whether the register values can be transferred from the readback bank 126 to the serial bank 128. Preferably, the readback enable RBEN transitions to logic high after the sync signal SYNC and/or frame count signal FRAME COUNT transition to logic high. This readback enable signal RBEN operates as a select or selection signal for multiplexers 136 to load the register values in parallel into the serial registers 134 from the readback registers 132. Once loaded, the register values can then be output through the serial-data-out SDO in synchronization with the clock signal CLK.

Since the register values are serially output from the serial bank 128, a certain number of cycles of the clock signal CLK are used. For example, for a 32-bit set of register values, 32 cycles of the clock signal would be used. Under certain conditions, though, a transition in the sync signal SYNC may occur during the serial output of the register values from the serial bank 128. This transition in the sync signal SYNC is referred to as an abort, and in conventional systems, an abort would require the command to be reloaded into the serial bank 128. However, in the DAC unit 100, the abort is sensed, and because the register values are maintained by the readback bank 126, the register values can be reloaded into the serial bank 128 (for serial output) without having to reload the command. Thus, the time used to load the command would be saved.

Figure 3:
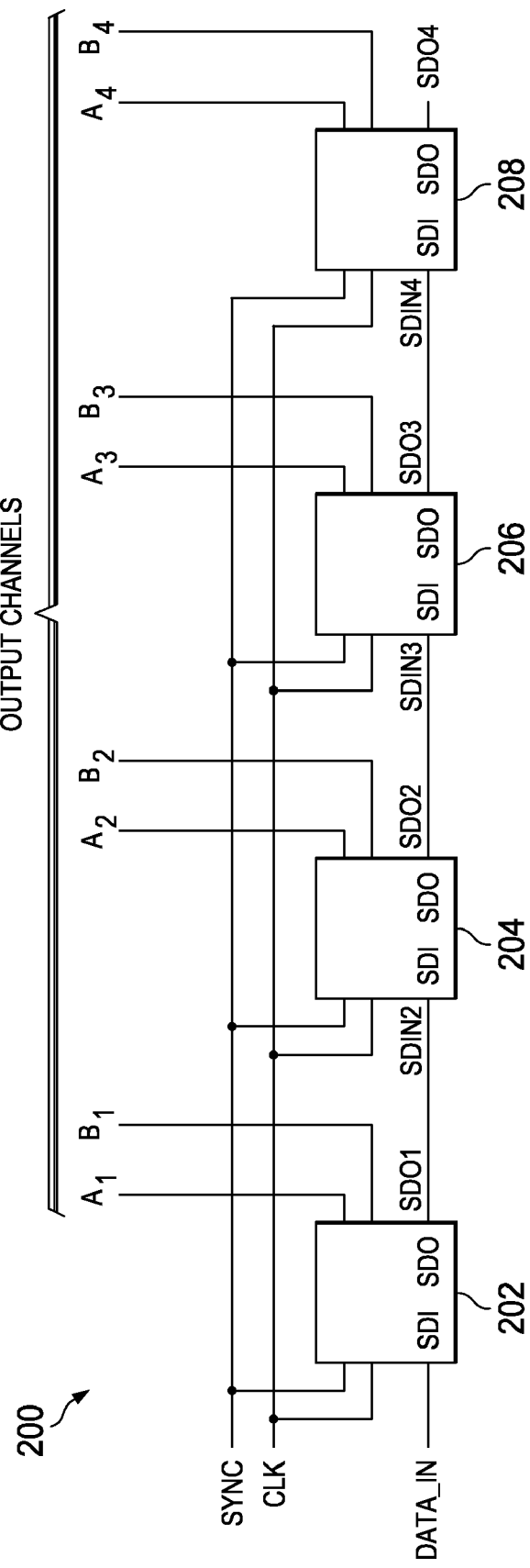
FIG. 3 is a plurality of DAC units of FIG. 1 arranged in a daisy-chain configuration in accordance with an embodiment of the present invention.

The DAC units 100 can also be used in a daisy-chain configuration 200 as shown in FIG. 3 to increase the number of total output channels ($A_{OUT1}$, $B_{OUT1}$, $A_{OUT2}$, $B_{OUT2}$, $A_{OUT3}$, $B_{OUT3}$, $A_{OUT4}$, and $B_{OUT4}$). In this configuration, the clock signal CLK and sync signal SYNC are shared among the DAC units 202, 204, 206, and 208. Serial data, such as a command, is received first through the serial-data-in SDIN1 of unit 202. The serial data is then transferred to the other units through their respective serial-data-ins (SDIN2, SDIN3, and SDIN4) and serial-data-outs (SDO1, SDOU2, and SDO3) as shown in FIG. 3.

Figure 4:
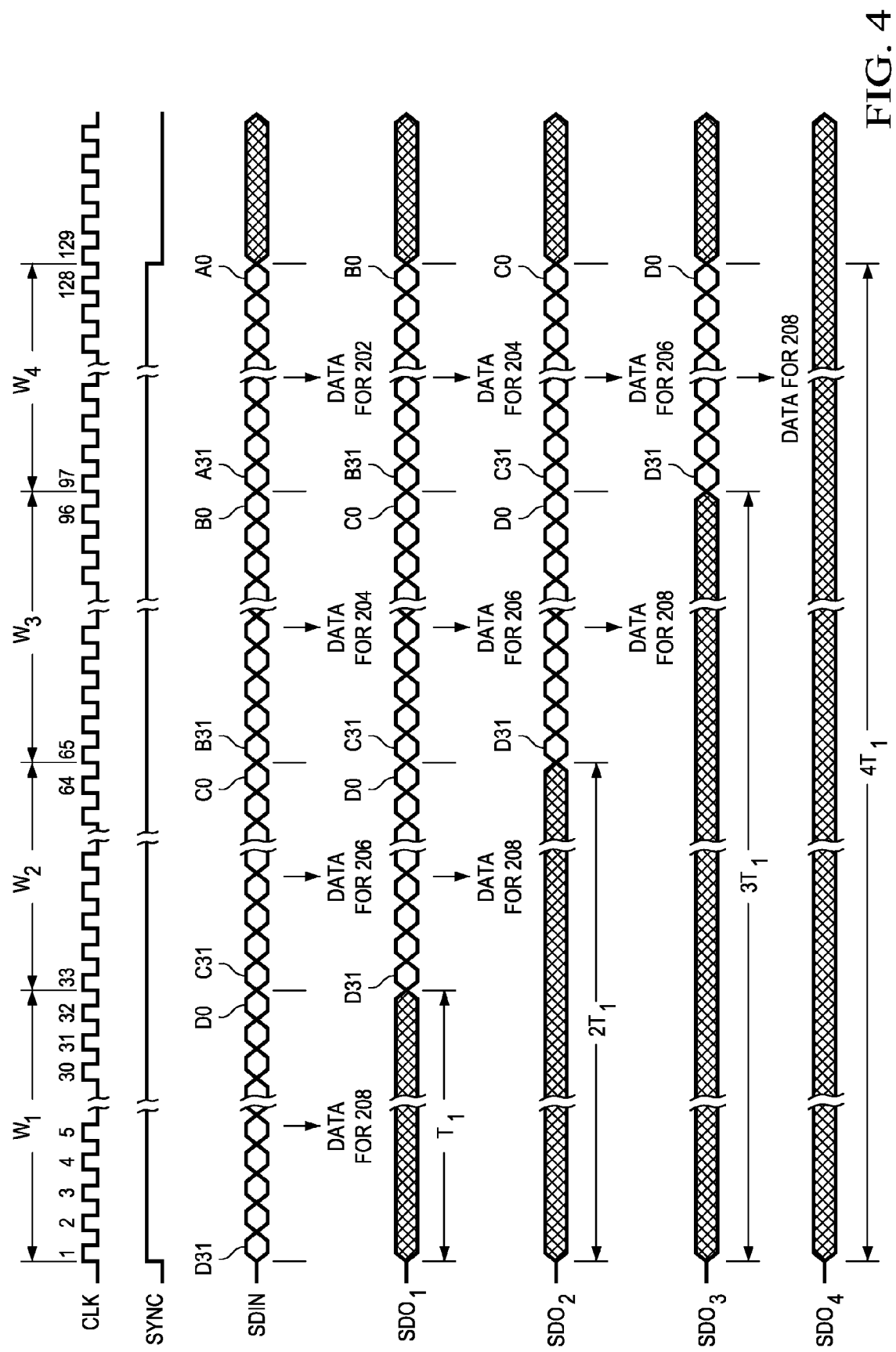
FIG. 4 is a timing diagram for the DAC units of FIG. 3.

FIG. 4 generally depicts the operation of serial loading data into the daisy-chain 200. At the onset of loading, the sync signal SYNC transitions from logic high to logic low. Data for unit 208 is loaded first. Data for unit 206 is loaded second. Data for unit 204 is loaded third, and data for unit 202 is loaded last. Each set of data is loaded in synchronization with the clock signal CLK, so the load time can be quite long. For example, with 8 DAC units operating at 10 MHz that use a 32-bit command for each DAC unit, the total load time would be about 0.026 ms. So an abort for conventional systems can be quite costly for a daisy-chain.

In order to generally ensure that the daisy-chain operates as desired, each DAC unit 202, 204, 206, and 208 employs a count register 138 (as shown in FIG. 1). The count register 138 is programmed to know the total cycles used for a serial load. Thus, the count register 138 is able to count the number of cycles of the clock signal CLK and compare the number of counted cycles to a predetermined or preprogrammed threshold value that corresponds to the number of DAC units in the daisy-chain and the length of the commands or serial data that is input.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A method comprising:
storing register values in a readback bank;
outputting the register values sequentially from the serial bank;
receiving an indicator by the serial bank;
determining whether the indicator was received by the serial bank prior to completion of the outputting of the register values; and
loading the register values into the serial bank from the readback bank if the indicator was received prior to completion of the outputting of the register values.

2. The method of claim 1, wherein the method further comprises the step of outputting the register values sequentially from the serial bank after the step of loading.

3. The method of claim 1, wherein the method further comprises:
receiving a second indicator, wherein the first indicator corresponds to an input of a readback command;
serially receiving the readback command by a plurality of serial registers arranged in a series in a serial bank; and
receiving a third indicator, wherein the second indicator indicates receipt of the feedback command.

4. The method of claim 1, wherein the step of determining further comprises the step of:
counting clock periods; and
comparing the counted clock periods to a predetermined threshold.

5. A digital to analog converter (DAC) unit comprising:
interface logic that receives a clock signal and a synchronization signal;
a DAC that receives a digital input signal from the interface logic and outputs an analog output signal;
command logic that is coupled to the interface logic and to the DAC, wherein the command logic includes:
a serial bank having a plurality of serial registers arranged in a series, wherein the serial bank sequentially loads a command signal into the serial registers in response to a first edge of the synchronization signal, and wherein the serial bank sequentially outputs register values; and
a readback bank having a plurality of readback registers, wherein each register corresponds to at least one of the serial registers, wherein the readback bank stores the register values, and wherein the readback bank loads the register values into the serial bank when a second edge of the synchronization signal is detected before a predetermined number of periods of the clock signal.

6. The DAC unit of claim 5, wherein the command logic further comprises decode logic adapted to output the register values to the serial bank and the readback bank.

7. The DAC unit of claim 6, wherein the readback bank further comprises a plurality of multiplexers, wherein each multiplexer is adapted to receive at least one register value from the decode logic and is adapted to receive feedback from at least one readback register.

8. The DAC unit of claim 7, wherein the DAC unit further comprises a count register that:
measures a number of clock cycles between successive edges of the synchronization signal;
compares the number of clock cycles to a predetermined threshold; and
outputs a frame count signal to the multiplexers of the readback bank.

9. The DAC unit of claim 5, wherein the serial bank further comprises a plurality of multiplexers, wherein each multiplexer is interposed between at least two serial registers, and wherein each multiplexer is adapted to transfer an output from one serial register to another serial register.

10. The DAC unit of claim 5, wherein the DAC unit further comprises an amplifier that amplifies the output of the DAC.

11. The DAC unit of claim 5, wherein the DAC unit further comprises:
an input register coupled to the interface logic; and
a DAC register interposed between the input register and the DAC.

12. An apparatus comprising:
a plurality of DAC units arranged in a daisy-chain, wherein each DAC unit has serial-data-in (SDIN) input and a serial-data-out (SDO) output, and wherein the first DAC unit of the daisy-chain is adapted to receive a command signal at its SDIN input and the last DAC unit is adapted to output register values at SDO output, and wherein each DAC unit between the first and the last DAC unit in the daisy-chain has its SDIN input coupled to the SDO output of the previous DAC unit, and wherein each DAC unit includes:

interface logic that receives a clock signal and a synchronization signal;

DAC that receives a digital input signal from the interface logic and outputs an analog output signal;

command logic that is coupled to the interface logic and to the DAC, wherein the command logic includes:

a serial bank having a plurality of serial registers arranged in a series, wherein the serial bank sequentially loads the command signal into the serial registers in response to a first edge of the synchronization signal, and wherein the serial bank sequentially outputs the register values; and a readback bank having a plurality of readback registers, wherein each readback register corresponds to at least one of the serial registers, wherein the readback bank stores the register values, and wherein the readback bank loads the register values into the serial bank when a second edge of the synchronization signal is detected before a predetermined number of periods of the clock signal.

13. The DAC unit of claim 12, wherein the command logic further comprises decode logic adapted to output the register values to the serial bank and the readback bank.

14. The DAC unit of claim 13, wherein the readback bank further comprises a plurality of multiplexers, wherein each multiplexer is adapted to receive at least one register value from the decode logic and is adapted to receive feedback from at least one readback register.

15. The DAC unit of claim 14, wherein the DAC unit further comprises a count register that:

measures a number of clock cycle between successive edges of the synchronization signal;

compares the number of clock cycles to a predetermined threshold; and outputs a frame count signal to the multiplexers of the readback bank.

16. The DAC unit of claim 12, wherein the serial bank further comprises a plurality of multiplexers, wherein each multiplexer is interposed between at least two serial registers, and wherein each multiplexer is adapted to transfer an output from one serial register to another serial register.

17. The DAC unit of claim 12, wherein the DAC unit further comprises an amplifier that amplifies the output of the DAC.

18. The DAC unit of claim 12, wherein the DAC unit further comprises:

an input register coupled to the interface logic; and a DAC register interposed between the input register and the DAC.

* * * * *